(12) United States Patent
Nishida et al.

(10) Patent No.: US 10,580,985 B2
(45) Date of Patent: Mar. 3, 2020

(54) DEPOSITION MASK, METHOD FOR MANUFACTURING THEREOF, AND METHOD FOR MANUFACTURING ORGANIC EL DISPLAY DEVICE

(71) Applicant: HON HAI PRECISION INDUSTRY CO., LTD., New Taipei (TW)

(72) Inventors: Koshi Nishida, Osaka (JP); Kozo Yano, Osaka (JP); Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/068,430

(22) PCT Filed: Jul. 22, 2016

(86) PCT No.: PCT/JP2016/071620
§ 371 (c)(1),
(2) Date: Jul. 6, 2018

(87) PCT Pub. No.: WO2017/119153
PCT Pub. Date: Jul. 13, 2017

(65) Prior Publication Data
US 2019/0013471 A1 Jan. 10, 2019

(30) Foreign Application Priority Data

Jan. 6, 2016 (JP) .................................. 2016-001071

(51) Int. Cl.
*H01L 51/00* (2006.01)
*C23C 14/12* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC . H01L 51/0011; H01L 27/3246; H01L 51/56; H01L 51/001; H01L 2227/323; C23C 14/24; C23C 14/042; C23C 14/12
See application file for complete search history.

(56) References Cited

U.S. PATENT DOCUMENTS

2004/0110366 A1 * 6/2004 MacKay .............. B23K 1/0016
438/613
2004/0221806 A1 11/2004 Kim
(Continued)

FOREIGN PATENT DOCUMENTS

CN 100519829 C 7/2009
JP 2001-279424 A 10/2001
(Continued)

*Primary Examiner* — Karen Kusumakar
(74) *Attorney, Agent, or Firm* — ScienBiziP, P.C.

(57) ABSTRACT

A deposition mask and a manufacturing method thereof capable of performing vapor deposition at a desired place, without causing any gap between the deposition mask and a substrate for vapor deposition having a surface of irregularity, even when depositing a vapor deposition material only at a predetermined place on a bottom part of the substrate for vapor deposition, are provided. The manufacturing method includes preparing a dummy substrate having irregularity corresponding to a surface shape of the substrate for vapor deposition (step S1), coating a liquid resin material on an uneven surface of the dummy substrate to form a resin coating layer (step S2), and raising the temperature of the resin coating layer and baking the resin coating layer to obtain a baked resin film (step S3). The manufacturing method further includes forming a desired opening pattern on the baked resin film attached to the dummy substrate to obtain a resin film having the desired opening pattern (step S4), and subsequently peeling off the resin film from the dummy substrate to obtain a deposition mask (step S6).

13 Claims, 11 Drawing Sheets

(51) Int. Cl.
  *C23C 14/24* (2006.01)
  *C23C 14/04* (2006.01)
  *H01L 27/32* (2006.01)
  *H01L 51/56* (2006.01)

(52) U.S. Cl.
  CPC .......... *C23C 14/24* (2013.01); *H01L 27/3246* (2013.01); *H01L 51/001* (2013.01); *H01L 51/56* (2013.01); *H01L 2227/323* (2013.01)

(56) References Cited

U.S. PATENT DOCUMENTS

| | | |
|---|---|---|
| 2008/0038935 A1 | 2/2008 | Baude et al. |
| 2014/0199808 A1* | 7/2014 | Sugimoto ............... B05B 12/20 438/99 |
| 2016/0168691 A1 | 6/2016 | Takeda et al. |

FOREIGN PATENT DOCUMENTS

| | | |
|---|---|---|
| JP | 2004-107723 A | 4/2004 |
| JP | 2004-335460 A | 11/2004 |
| WO | 2013/039196 A1 | 3/2013 |
| WO | 2014/167989 A1 | 10/2014 |
| WO | 2015/034097 A1 | 3/2015 |

\* cited by examiner

DEPOSITION MASK, METHOD FOR MANUFACTURING THEREOF, AND METHOD FOR MANUFACTURING ORGANIC EL DISPLAY DEVICE

TECHNICAL FIELD

The present disclosure relates to a deposition mask and a method for manufacturing thereof, which are employable in depositing an organic layer of an organic EL display device. More specifically, the present disclosure relates to a deposition mask, a method for manufacturing thereof, and a method for manufacturing an organic EL display device using the deposition mask, in which even in the case of depositing a vapor deposition material at a predetermined place on a substrate having a surface of irregularity, the deposition material is disposed at the predetermined place without leaving the deposition material at an unnecessary place.

BACKGROUND ART

In general, the manufacturing of an organic EL display device includes depositing an organic layer at places corresponding to respective pixels on a substrate having switching elements such as TFTs formed beforehand. Therefore a deposition mask is disposed on the substrate beforehand and thereafter an organic material is disposed on the substrate via the deposition mask, so that a required amount of organic layer can be deposited for only required pixels. And, conventionally used as the deposition mask are metal masks. However, forming a fine pattern is the recent trend and therefore resin films trend to be used in place of metal masks in many cases.

Further, a method is known by providing a film-like mask member made of such as PET or polyimide, on a substrate for vapor deposition and irradiating the mask member with a laser beam to provide an opening pattern for forming a mask, thereafter vapor depositing an organic material via the opening of the mask, and subsequently peeling off the mask (see Patent Document 1).

PRIOR ART DOCUMENT

Patent Document

Patent Document 1: JP 2013-20764 A

SUMMARY OF THE INVENTION

Problem to be Solved by the Invention

When a deposition mask (such as a metal mask or a resin film) is used to perform vapor deposition on a substrate for vapor deposition having a surface of irregularity (an uneven surface) as mentioned above, the contact between the deposition mask and the substrate for vapor deposition is limited only at a convex surface of the deposition mask. Therefore, the deposition material possibly enters into a concavity of the substrate for vapor deposition to be inherently covered by the deposition mask. For example, in the case of vapor depositing an organic layer of an organic EL display device, flattening irregularity due to the TFTs and other part by using a flattening layer made of, for example, resin to be provided thereon and forming a bank for partitioning each pixel on the flattening layer, and thereafter a deposition mask is overlapped on an upper surface of the bank with aligning each other and vapor deposition is performed. Therefore, the deposition material is deposited even on a sidewall of the bank on a lower side of the deposition mask. As a result, when each pixel of the organic EL display device is emitted, the light emitted from the organic layer on the side wall of the bank travels in an oblique direction and is mixed with light of a neighboring pixel to form an unclear image.

Further, as discussed in the above-mentioned Patent Document 1, the mask forming method including mounting a film-like mask member on a TFT substrate having surface of irregularity at a place where an organic material is to be deposited and irradiating the mask member with a laser beam to form an opening pattern cannot cover a concavity of the TFT substrate since the mask to be mounted on the uneven surface is in a film state. The above-mentioned method includes forming the opening on the mask member while visually confirming an anode electrode through the mask member, and therefore it can be predicted that the positioning of the mask opening with respect to a predetermined position of the TFT substrate to be deposited is accurate. However, the above-mentioned problem that the deposition material is unintentionally deposited between the deposition mask and the place of the TFT substrate to be deposited cannot be solved. More specifically, when the TFT substrate has irregularity on a surface thereof, completely bringing the mask member and the TFT substrate into close contact with each other is difficult. For example, overlapping a film-like deposition mask on a bank and performing vapor deposition to manufacture an organic EL display device causes the problem of color mixing between pixels because the deposition material is unintentionally deposited on a sidewall of the bank and the light is emitted in an oblique direction from the sidewall of the bank.

In addition, as mentioned above, directly forming a mask member on a TFT substrate and using it as a deposition mask to deposit an organic material requires irradiating the deposition mask with a laser beam when forming an opening pattern of the deposition mask and may deteriorate device characteristics of TFTs. In addition, for example, even in the case of using a common organic material for two or more RGB sub pixels including a hole injection layer, a hole transport layer, an electron transport layer, and the like, forming organic deposition layer for each of the RGB sub pixels is required. More specifically, even in the case of vapor depositing the same material for the same layer portion in each of the RGB sub pixels, it requires to deposit the same material separately again in each sub pixel and accordingly not only the materials are wasted but also the number of manufacturing processes increases greatly. In addition, for example, it requires removing the deposition mask after completing the deposition of R sub pixels and form another deposition mask for G sub pixels again. There may be adverse effects on the organic materials of the already deposited R sub pixel.

To solve the afore-mentioned problems, the present disclosure intends to provide a deposition mask and a manufacturing method thereof in which it is capable of performing vapor deposition at a desired place even when a vapor deposition material is deposited at a predetermined place only on a bottom part of a substrate for vapor deposition having uneven surface, without causing any gap between the deposition mask and the substrate for vapor deposition.

Another object of the present disclosure is to provide a deposition mask and a manufacturing method thereof capable of surely depositing a vapor deposition material at a desired place when depositing the deposition material, without impeding the evaporating of deposition material from a vapor deposition source.

Still another object of the present disclosure is to provide a method for manufacturing the deposition mask capable of adjusting a linear expansion coefficient of a deposition mask so as to prevent a pattern misalignment from occurring between the substrate for vapor deposition and the deposition mask due to a difference in linear expansion coefficient.

Still another object of the present disclosure is to provide a method for manufacturing an organic EL display device by using the above-mentioned deposition mask, more specifically, a method for performing vapor deposition so as to prevent the deposition material from being deposited at an unnecessary place when manufacturing the organic EL display device.

Means to Solve the Problem

A deposition mask according to the present disclosure is a deposition mask for forming a deposition layer by vapor deposition at a predetermined place on a surface of a substrate for vapor deposition having a surface of irregularity, wherein the deposition mask is formed of a resin film so as to have one surface having a flat surface and the other surface having an uneven surface corresponding to an inversed shape of the surface of irregularity of the substrate for vapor deposition, and wherein the deposition mask has an opening formed at a portion corresponding to the predetermined place.

The opening is preferably formed in a taper shape in such a manner that an open area decreases in a direction from the one surface to the other surface, and a taper angle of the taper shape is preferably equal to or less than a vapor deposition angle of a deposition material evaporating from a deposition material source, so as to prevent the evaporating deposition material from being blocked by the deposition mask.

Here, the taper angle is an angle formed between a ridge line of a taper shape and a base line of the taper shape, for example, angle α formed between a bottom surface (a plane orthogonal to an central axis of the taper shape) and a wall surface of an opening 13, as illustrated in FIG. 5A, more specifically, angle α formed between a bottom surface and a wall surface of a remaining convex portion 12a resulting from formation of the opening 13, or angle β formed between a bottom surface and an inclined surface of a taper-shaped portion of a dummy bank 33. The vapor deposition angle is an angle determined by the shape of an opening of a container of a vapor deposition source, namely θ illustrated in FIGS. 5B to 5D, and is a complementary angle of a half of an evaporating angle (maximum angle of a spread angle by which the deposition material is evaporated) of a deposition material (vapor deposition particles) evaporated from the vapor deposition source, more specifically, an acute angle formed between the trajectory of the vapor deposition particles and a horizontal plane at the maximum spread angle of the deposition material.

A deposition mask manufacturing method according to the present disclosure is a method for manufacturing a deposition mask for forming a deposition layer at a predetermined place on a surface of a substrate for vapor deposition having an irregularity on the surface, by depositing a deposition material at the predetermined place. The manufacturing method includes preparing a dummy substrate having an irregularity on a surface thereof corresponding to the irregularity of the surface of the substrate for vapor deposition, forming a resin coating layer by coating the irregularity of the surface of the dummy substrate with a liquid resin material, the liquid resin material being applied until a surface thereof becoming substantially flat, forming a baked resin film by raising the temperature of the resin coating layer up to a hardening temperature of the resin material to bake the resin coating layer, forming a resin film having a desired opening pattern by irradiating the baked resin film attached to the dummy substrate with a laser beam to form the desired opening pattern on the baked resin film, and peeling off the resin film from the dummy substrate to obtain a deposition mask.

When forming the opening pattern with irradiation of the laser beam, the laser beam is irradiated such that a periphery of each opening of the opening pattern may be formed into a taper shape in the thickness direction on the resin film, by forming a laser mask such that the transmittance of the laser beam deteriorates toward a peripheral edge of an opening at the periphery of the opening of the laser mask.

The baking of the resin coating layer may be performed while adjusting at least one of coating thickness of the resin material, baking temperature at the time of baking, baking time, and a profile of the baking temperature and the baking time, so that a difference between a linear expansion coefficient of the baked resin film formed by baking and a linear expansion coefficient of the substrate for vapor deposition becomes equal to or less than 3 ppm/° C.

A method for manufacturing an organic EL display device according to the present disclosure comprises preparing a dummy substrate having an irregularity corresponding to a surface of a substrate for vapor deposition, the substrate for vapor deposition being to be deposited with the organic material, coating a liquid resin on a surface having the irregularity of the dummy substrate until a surface thereof becoming substantially flat and baking the liquid resin to obtain a baked resin film, and irradiating the baked resin film with a laser beam to obtain a resin film having an opening pattern formed thereon, forming a deposition mask by peeling off the resin film from the dummy substrate, positioning and overlapping the deposition mask with the substrate for vapor deposition, the substrate for vapor deposition being formed with a TFT, a first electrode, and a bank for partitioning each pixel on a device substrate, and vapor depositing an organic material to form an organic layer on the substrate for vapor deposition, and removing the deposition mask and forming a second electrode.

It is preferable that further comprising, forming the bank so as to have a taper shape in cross section so that a taper angle of the bank becomes equal to or less than a vapor deposition angle of a deposition material evaporated from a vapor deposition source of the organic material, because vapor deposition can be performed at a desired place without impeding the evaporating of deposition material from the vapor deposition source. The taper angle and the vapor deposition angle are the same as those described above.

Effects of the Invention

The deposition mask according to the present disclosure has a front surface having a planar shape and a back surface having an uneven shape (irregularity) corresponding to a shape inverted from the uneven shape of the substrate for vapor deposition. Therefore, even when the deposition mask is overlapped with a substrate for vapor deposition having a surface of irregularity, the deposition mask can be accurately positioned with respect to the substrate for vapor deposition because of engagement of unevenness. In addition, since the deposition mask engage irregularity of the surface of the substrate for vapor deposition, even a stepped portion can be completely covered. As a result, for example, when the deposition mask is used for an organic EL display device, the deposition mask can cover a sidewall of a bank and no organic material remains on the sidewall of the bank after removal of the deposition mask. More specifically, even in the case of vapor depositing a deposition material on a substrate for vapor deposition having uneven surface, no deposition material is deposited at a place where no deposition is required.

Further, the opening formed in the deposition mask has a shape tapered in the thickness direction of the deposition mask in such a way as to become smaller diameter of the opening in the depth direction. The tapered opening being smaller toward its end can be formed so as to agree with a predetermined region where a desired deposition material is to be deposited. In addition, setting the taper angle to be equal to or less than the vapor deposition angle of the vapor deposition source is preferable in that the deposition material can be uniformly deposited so as to have a desired thickness uniformly at a desired place because the deposition material evaporating from the vapor deposition source is not blocked by the deposition mask.

By the deposition mask manufacturing method according to the present disclosure a deposition mask fitting to the uneven shape of the substrate for vapor deposition can easily obtained, because the deposition mask is formed by coating a liquid resin material on the dummy substrate having irregularity similar to the uneven surface of the substrate for vapor deposition. In addition, since the deposition mask covers a portion other than the predetermined place, no deposition material is deposited on an undesired place. Using one of substrates to which the deposition material is to be inherently deposited may be used as a dummy substrate. Using a metal plate imitating the uneven surface shape, as a dummy substrate, is also preferable. Since raising the temperature up to approximately 500° C. is necessary to bake and solidify the resin material of the deposition mask, having heat-resisting property endurable at high temperature of this level is required. Other materials, if they have sufficient heat-resisting property, are also usable. Further, as a replacement for the substrate for vapor deposition to be actually used, it may also be available to form a substrate omitting any elements to be hidden by a flattening layer and including only the bank and the like formed on the flattening layer.

According to the manufacturing method for the organic EL display device according to the present disclosure, no organic material is deposited on the sidewall of the bank. Therefore, the problem of color mixing with another pixel does not arise. Further, since a display device using uniform light emitted from a uniform organic layer in each pixel is feasible, an organic EL display device excellent in display quality can be obtained.

EMBODIMENT FOR CARRYING OUT THE INVENTION

Figure 1:
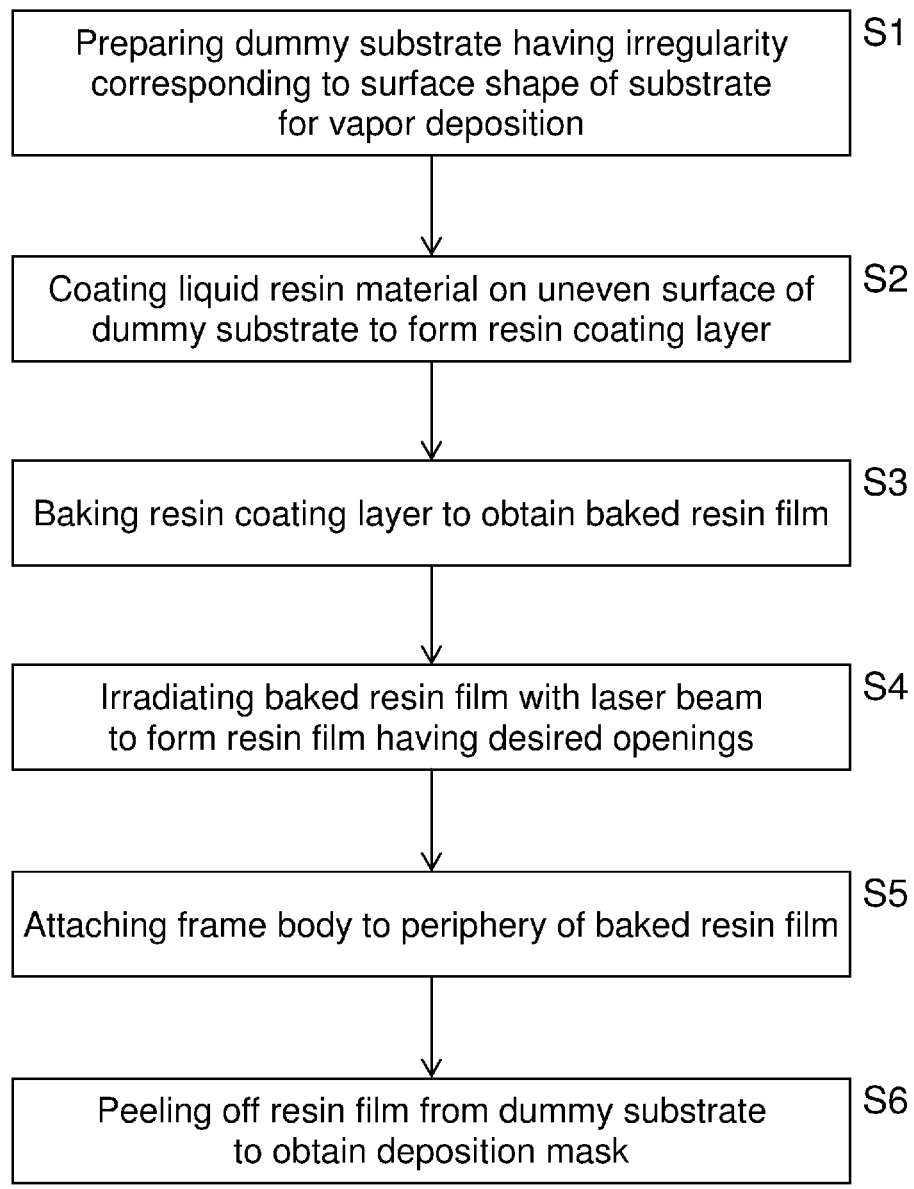
FIG. 1 is a flowchart illustrating a method for manufacturing a deposition mask according to an embodiment of the present disclosure.

A deposition mask and a manufacturing method thereof according to an embodiment of the present disclosure will be described in detail below with reference to attached drawings illustrating a manufacturing method of an organic EL display device. FIG. 1 is a flowchart illustrating a method for manufacturing a deposition mask according to an embodiment of the present disclosure. FIGS. 2A to 3D are plan views and cross-sectional views illustrating steps S3 to S6 of the flowchart illustrated in FIG. 1.

The deposition mask according to the present embodiment is a deposition mask 10 for forming a deposition layer by vapor deposition at a predetermined place on a surface of a substrate for vapor deposition having uneven surface. As understood from a partially cross-sectional view illustrated in FIG. 3D, the deposition mask 10 includes a resin film 11 having one surface 10a with a planar shape and the other surface 10b with an uneven (irregular) shape part 12 corresponding to a shape inverted from an uneven (irregular) shape of a substrate for vapor deposition 20 (see FIG. 4A). The deposition mask 10 further includes an openings 13 provided at a portion corresponding to the predetermined place. According to the example illustrated in FIG. 3D, formation of the openings 13 in the resin film 11 leaves convex portions 12a having a taper shape, respectively corresponding to the tapering of the each of openings 13. The reason for the taper shape and the taper angle thereof will be described in detail below.

Coating and baking a liquid resin material can form the resin film 11, as described below. Therefore, even when the substrate for vapor deposition 20 has the uneven surface (see FIG. 4A), the deposition mask 10 having the inverted uneven shape part 12 corresponding to the unevenness of the substrate for vapor deposition can be easily formed. An exemplary material is a resin having heat-resisting property, as described below. A polyimide film capable of adjusting the linear expansion coefficient depending on baking conditions is preferable. However, the material is not limited to the examples described above. The polyimide before being subjected to baking is in a liquid state and low in viscosity. Therefore, the uneven shape of a surface of the substrate for vapor deposition 20 is not limited specifically. Therefore, it is applicable to various types of unevenness. In the example of described below, the substrate is used for deposition, the substrate having a flattening layer on a surface of TFTs and the like and further having a bank 23 for partitioning each sub pixel on the surface (see FIG. 4A). However, it is available even in the case of directly vapor depositing an organic material on an uneven surface of TFTs and the like, the deposition mask 10 fitting to the unevenness can be formed.

Figure 2A:
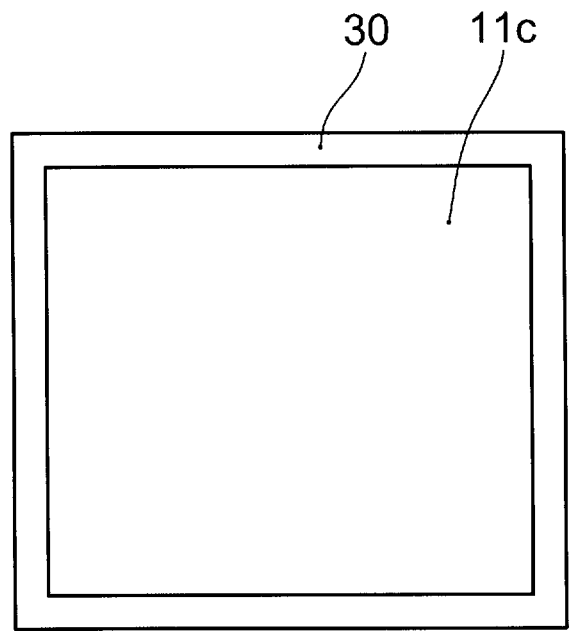
FIG. 2A is a plan view illustrating a step S3 of the flowchart illustrated in FIG. 1.
Figure 2B:
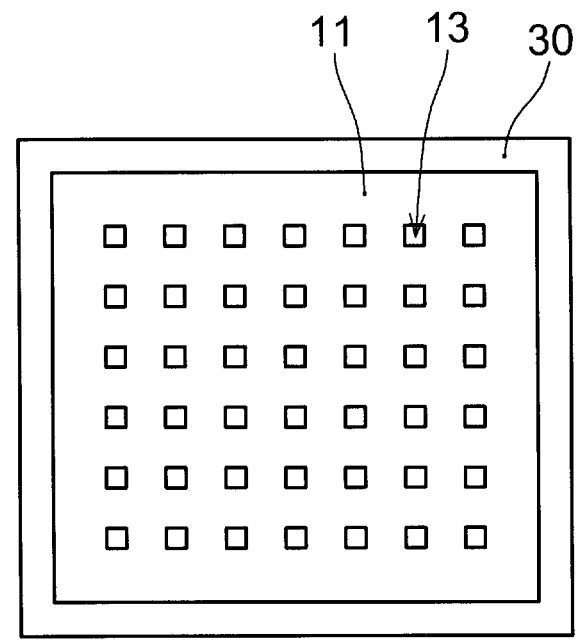
FIG. 2B is a plan view illustrating a step S4 of the flowchart illustrated in FIG. 1.
Figure 2C:
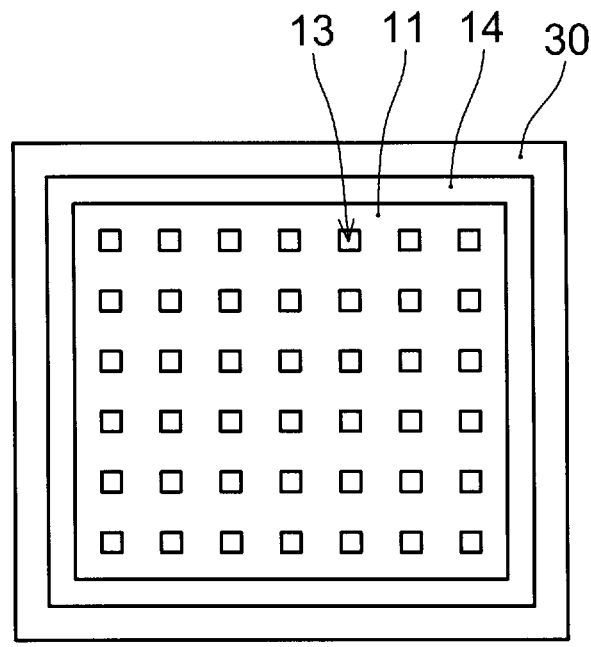
FIG. 2C is a plan view illustrating a step S5 of the flowchart illustrated in FIG. 1.
Figure 2D:
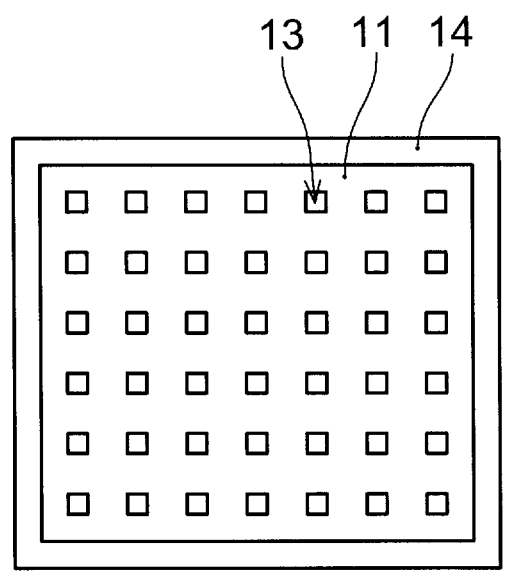
FIG. 2D is a plan view illustrating a step S6 of the flowchart illustrated in FIG. 1.
Figure 3A:
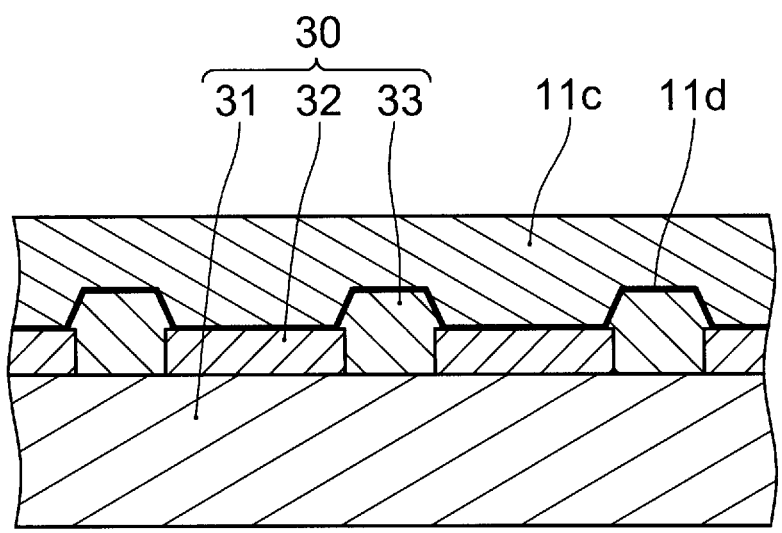
FIG. 3A is a cross-sectional view illustrating the step S3 of the flowchart illustrated in FIG. 1.
Figure 3B:
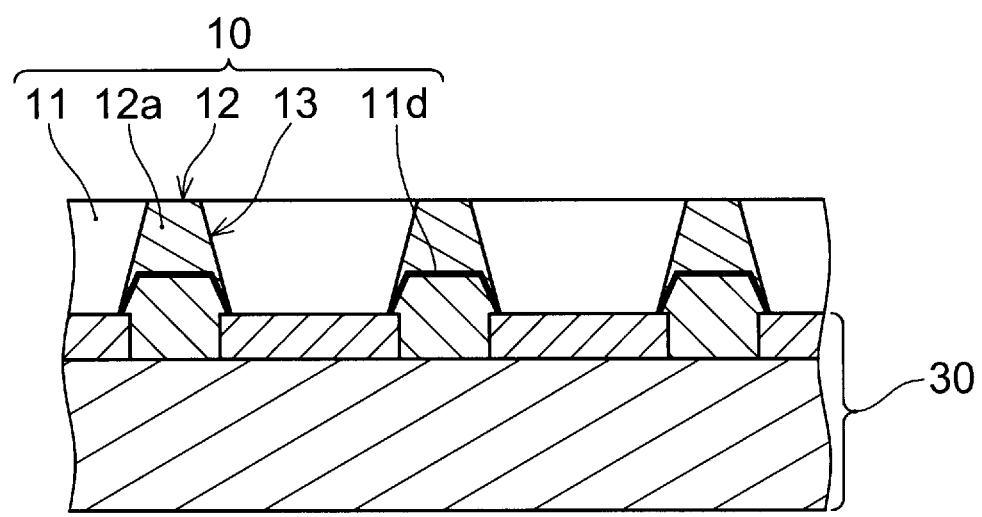
FIG. 3B is a cross-sectional view illustrating the step S4 of the flowchart illustrated in FIG. 1.
Figure 3C:
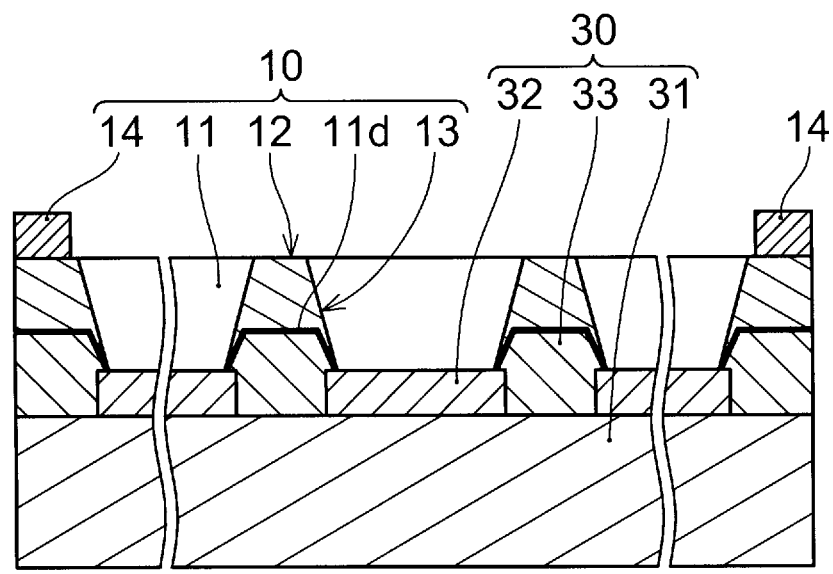
FIG. 3C is a cross-sectional view illustrating the step S5 of the flowchart illustrated in FIG. 1.
Figure 3D:
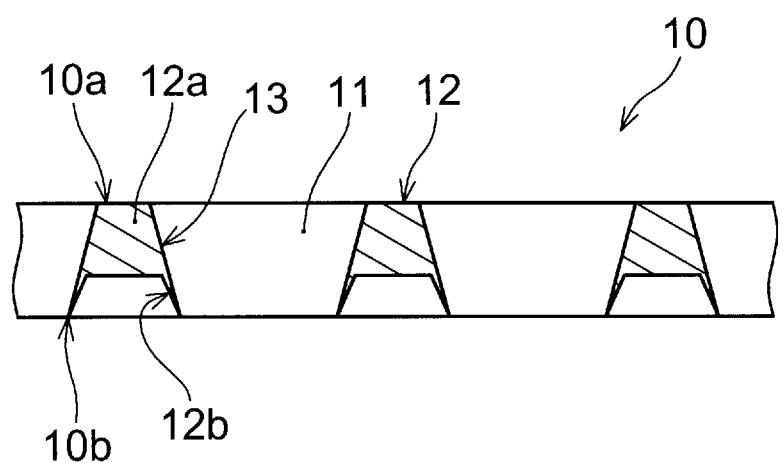
FIG. 3D is a cross-sectional view illustrating the step S6 of the flowchart illustrated in FIG. 1.
Figure 4A:
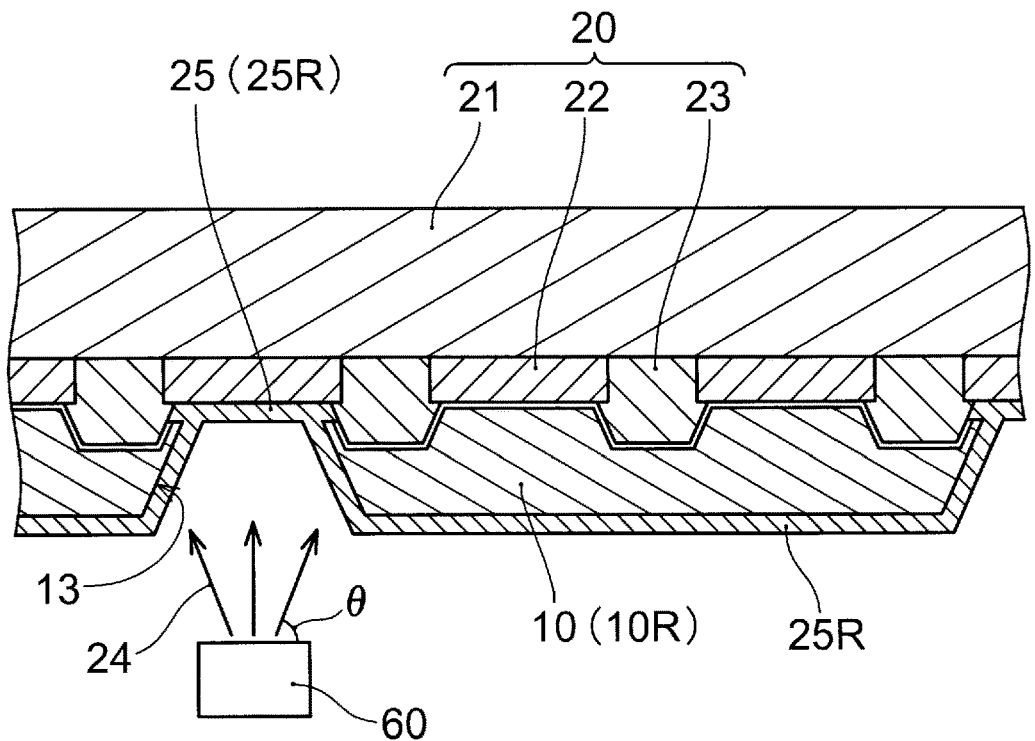
FIG. 4A is a cross-sectional view illustrating a manufacturing process of an exemplary method for manufacturing an organic EL display device according to the present disclosure.

As FIG. 1 illustrates the flowchart and FIGS. 2A to 3D illustrate plan and cross-sectional views of manufacturing processes in steps S3 to S6 of the flowchart illustrated in FIG. 1, the manufacturing of the deposition mask 10 includes, as step S1, preparing a dummy substrate 30 (see FIG. 3A) having irregularity corresponding to a surface shape of the substrate for vapor deposition 20 (see FIG. 4A). The manufacturing of the deposition mask 10 further includes, as step S2, coating a liquid resin material 11a (see FIG. 6) on the uneven surface of the dummy substrate 30 to form a resin coating layer 11b (see FIG. 6). The manufacturing of the deposition mask 10 further includes, as step S3, baking the resin coating layer 11b by raising the temperature of the resin coating layer 11b up to the curing (hardening) temperature of the resin material, to form a baked resin film 11c as illustrated in FIGS. 2A and 3A. This manufacturing process forms a short-wavelength light absorbing layer 11d between the baked resin film 11c and the dummy substrate 30. The manufacturing of the deposition mask 10 further includes, as step S4, irradiating the baked resin film 11c attached to the dummy substrate 30 with a laser beam, via a laser mask 41, as illustrated in FIG. 7A, so as to form the resin film 11 having a desired pattern of openings 13, by forming the desired pattern of the openings 13 on the baked resin film 11c, as illustrated in FIGS. 2B and 3B. The manufacturing of the deposition mask 10 further includes, as step S5, attaching a frame body 14 along the periphery of the resin film 11, as illustrated in FIGS. 2C and 3C. The manufacturing of the deposition mask 10 further includes, as step S6, peeling off the resin film 11 from the dummy substrate 30 to leave the deposition mask 10.

More specifically, in the present disclosure, by coating and baking the resin material 11a on the dummy substrate 30, the deposition mask 10 made of a resin film is formed. Therefore, it is characteristic of the disclosure that the substrate for vapor deposition 20 (see FIG. 4A) is not required to have a flat surface and, even when the substrate for vapor deposition 20 has surface of irregularity, the deposition mask 10 fitting to the unevenness can be formed. As a result, even in the case of overlapping the deposition mask on the substrate for vapor deposition having surface of irregularity, obtaining a device having an excellent performance is feasible because only a desired place can be exposed while the unevenness can be entirely covered. For example, when an organic EL display device is manufactured, the deposition mask 10 (see FIG. 4A) is placed on the bank 23 partitioning each sub pixel to be formed on a flattening layer. In this case, if the deposition mask is planar, a stepped portion is generated between an upper surface of the bank 23 and a sub pixel region positioned on a bottom side of the bank 23 and accordingly the deposition material is deposited on the sidewall of the bank 23. However, the present embodiment can solve the problem that the deposition material is deposited on a portion other than the predetermined place because the deposition mask 10 can surely cover the sidewall region.

Hereinafter, the method for manufacturing the deposition mask 10 will be described in more detail. First, as step S1 of the flowchart illustrated in FIG. 1, the manufacturing method includes preparing the dummy substrate 30 (see FIG. 3A) so as to have an uneven surface corresponding to the surface having irregularity of the substrate for vapor deposition 20 (see FIG. 4A) to which the deposition material is to be deposited. The dummy substrate 30 is a substrate for coating and baking the resin material 11a (see FIG. 6) and has unevenness similar to the substrate for vapor deposition 20 so that the back surface of the manufactured resin film 11 can fit to the surface irregularity of the substrate for vapor deposition 20. More specifically, dummy electrodes 32 and dummy banks 33 corresponding to surface having irregularities of the first electrodes 22 and the banks 23 of the substrate for vapor deposition 20 (see FIG. 4A) are formed on the surface of a dummy TFT substrate 31. Further, as the dummy TFT substrate, the material durable at the baking temperature of the resin material 11a is used. For example, in the case of forming a deposition mask for an organic EL display device, as many substrates for vapor deposition 20 are manufactured at a time, one of these substrates can be used as the dummy substrate 30.

However, when the bank 23 of the substrate for vapor deposition 20 is made of an acrylic resin or the like, it may not endure the temperature at the time of baking the resin coating layer 11b. Therefore, using an inorganic substance such as $SiO_x$ or $SiN_y$ is preferable. Further, since the deposition mask 10 is preferable slightly larger than the actual substrate for vapor deposition 20, forming an overhanging portion around the actual substrate for vapor deposition 20 or providing the frame body at an outer peripheral side of the resin film 11 is preferable. In addition, as long as the surface shape is identical, TFT or the like formed beneath a flattening layer (although not illustrated, a layer on the surface side of a TFT substrate 21) can be omitted. Since these TFT substrates 21 are formed in a similar shape, an arbitrary one of the TFT substrates 21 is usable as the dummy substrate 30 to manufacture the deposition mask 10. Using such a deposition mask 10 for other TFT substrate may not cause any gap because it can completely fit to the unevenness of the substrate for vapor deposition 20. In addition, a metal plate or the like different from the TFT substrate 21 is employable. However, the material to be employed is preferably not only durable at the baking temperature (approximately 500° C.) of the resin material 11a but also approximately 3 ppm or less different from the actual substrate for vapor deposition 20 in linear expansion coefficient. The reason for the above is as follows.

More specifically, in the case of using the deposition mask for an organic layer of an organic EL display device, the deposition mask is fixedly placed on a substrate for vapor deposition on which the organic layer is to be formed. Therefore, if the difference in linear expansion coefficient between the deposition mask and the substrate for vapor deposition becomes larger, a positional deviation occurs between vapor deposition regions of pixels intended as the substrate for vapor deposition and openings of the deposition mask. For example, when one side of a display panel is 100 cm and an opening (each of color sub pixels of an organic layer to be deposited) is a 60 μm square, and if the misalignment allowance is supposed to 9 μm (15% of 60 μm), a positional deviation of 9 μm (allowable upper limit) will occur in response to an increase of 3° C. (temperature increase at the timing of vapor deposition) when the linear expansion coefficient difference is 3 ppm. The size of each sub pixel is an exemplary value when the one side of the display panel is 100 cm. In general, one side of a display panel and one side of each sub pixel change substantially proportionally if the resolution is the same. Therefore, for example, when the display panel is 50 cm, the length of one side of the sub pixel is required to be 30 μm to realize the same resolution (resolution of 5.6k according to the above-mentioned example). Accordingly, the allowable misalignment value for the length of 50 cm is 4.5 μm (15%). More specifically, since the expansion of 4.5 μm/50 cm is allowed in change of 3° C., the linear expansion coefficient is 3 ppm/° C. and this relationship holds for display devices of any size.

Accordingly, it is required that the difference in linear expansion coefficient between the deposition mask 10 and a substrate to which the mask is to be applied (the substrate for vapor deposition 20) is equal to or less than 3 ppm/° C. On the other hand, if the linear expansion coefficient difference between the resin film 11 formed of this resin material and the dummy substrate 30 is large, the resin film 11 tends to be curled due to the influence of thermal distortion after the resin film 11 having a fine pattern formed by laser machining is peeled off from the dummy substrate 30 at the room temperature. The temperature of the resin coating layer 11b at the time of being baked is significantly high temperature not less than 400° C. and not greater than 500° C. Therefore, although the dimensional difference due to thermal expansion at the time of baking becomes large, the problem of pattern misalignment does not arise since the formation of the fine pattern by laser machining is performed at the room temperature. However, although the heating remains local and the expansion of the resin film is negligible when the laser beam used for the laser machining has a very small pulse width of about femtoseconds, the usage of a laser beam having a usual pulse width of several μsec will induce a temperature increase of approximately several ° C. Therefore, it is preferable that the linear expansion coefficient difference between the resin film 11 and the dummy substrate 30 is equal to or less than approximately 3 ppm/° C. More specifically, the linear expansion coefficient difference between the substrate used as the deposition mask and the dummy substrate 30 is desirably 6 ppm/° C. or less, considering ±3 ppm/° C., and is more preferably 3 ppm/° C.

Figure 6:
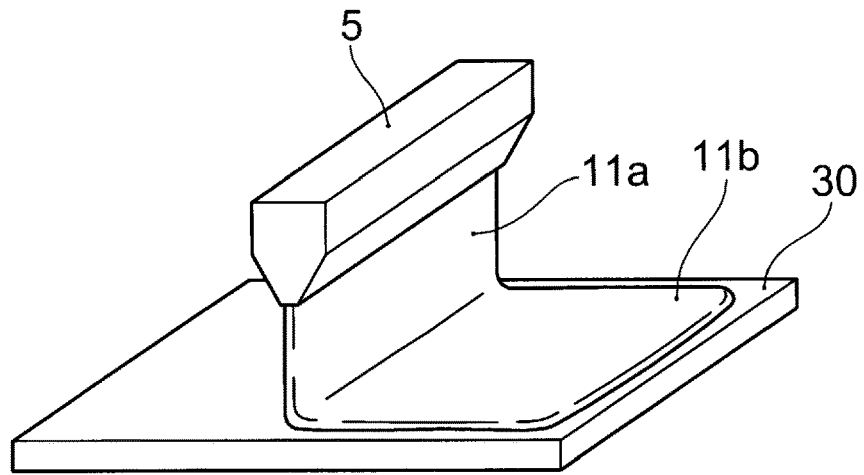
FIG. 6 illustrates an exemplary formation of a resin coating layer illustrated in FIG. 2A.
Figure 7A:
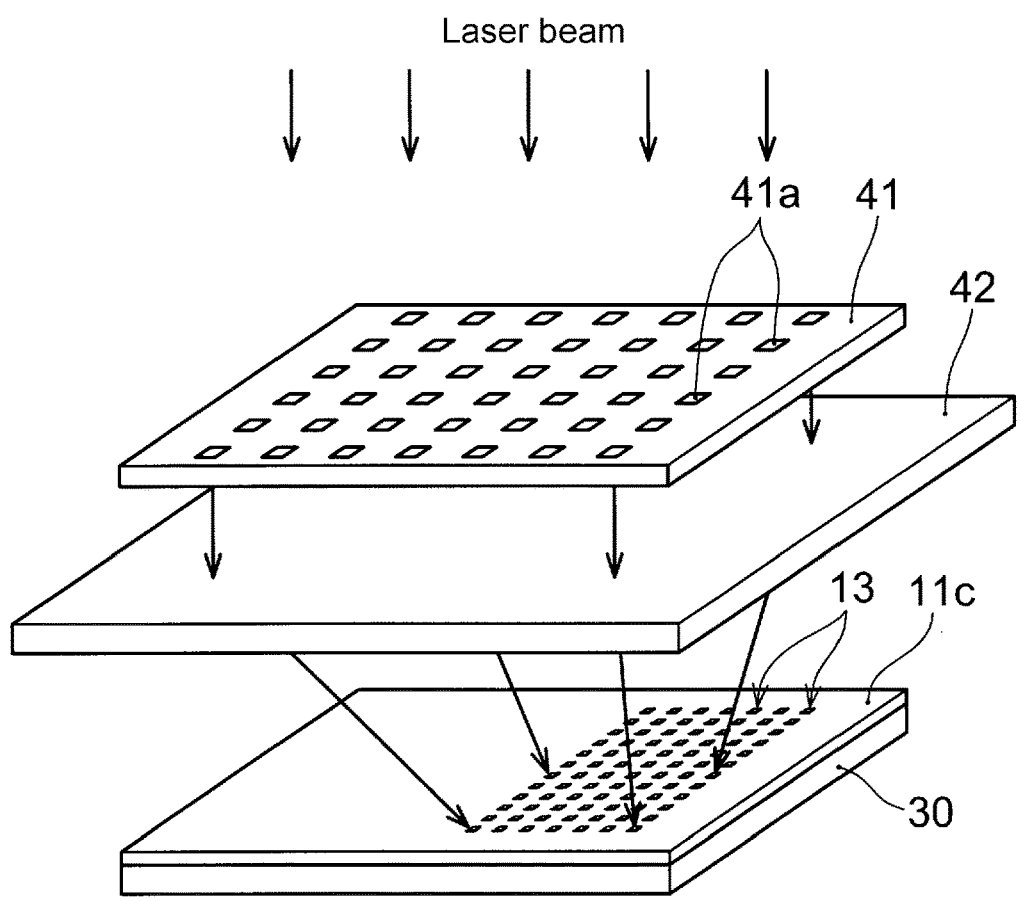
FIG. 7A illustrates an exemplary irradiation with a laser beam for formation of openings of the deposition mask.

Next, as step S2 of the flowchart illustrated in FIG. 1, the manufacturing method includes coating the liquid resin material 11a (see FIG. 6) on the dummy substrate 30 to form the resin coating layer 11b (see FIG. 6). The coating of the liquid resin material 11a can be realized by any method as long as controlling the film thickness is feasible. For example, as illustrated in FIG. 6, a slit coating method is employable for the coating. More specifically, the slit coating method includes discharging the liquid resin material 11a in a band shape from a tip end of a slot die 5 sequentially moving to perform coating, while supplying the resin material 11a to the slot die 5. In this case, the discharge amount of the liquid resin material 11a may be not completely uniform, the liquid resin material 11a may be not completely flattened in the coated state and the surface may undulate in some cases. This is because the viscosity of the material is set to a somewhat higher level so that the coating film has a thickness of approximately several μm to several tens μm. However, the surface is substantially flat even in the undulated state and can be flattened in the subsequent baking process because the viscosity once drops during heating. Therefore, a flat surface can be finally obtained. As a result, the resin coating layer 11b not less than 3 μm and not greater than 10 μm can be formed on a convex surface of the dummy substrate 30, and the surface can be substantially flattened. Even in a case where the coating of the liquid resin material 11a entraps air bubbles, the size of air bubbles does not exceed 100 nm since the thickness of the resin coating layer 11b is approximately 20 μm or less even at a thicker portion (corresponding to the concavity of the dummy substrate 30). The resin coating layer 11b in close contact with the dummy substrate 30 can be formed on the entire surface of a fine patterning region for the openings 13. The method for coating the liquid resin material 11a is not limited to the above-mentioned slit coating. For example, a spin coating or any other appropriate coating method is employable. The spin coating can obtain the resin coating layer 11b that is in close contact with the dummy substrate 30 and has a flat surface, although it is unsuitable from the viewpoint of usage efficiency of the material in the case of forming a large resin film.

The liquid resin material 11a is preferably a material that can be baked and can absorb a laser beam to be used for laser machining. However, as mentioned above, when the resin film 11 is used as the deposition mask 10, it is preferable that the difference in linear expansion coefficient of between the material and the substrate for vapor deposition 20 on which the deposition mask 10 is to be placed, and the difference in linear expansion coefficient between the material and the dummy substrate 30 on which the resin coating layer 11b is to be formed is small. In general, since a glass plate is usable as a substrate of an organic EL display device, polyimide is preferable. Polyimide is a generic name for polymer resins containing imide bonds. Heating/baking polyamic acid (liquid at room temperature) serving as a precursor can promote the imidization reaction and obtain film-like polyimide. In addition, since the linear expansion coefficient is adjustable depending on baking conditions, polyimide is preferable in easy matching with the linear expansion coefficients of the substrate for vapor deposition 20 of the above-mentioned organic EL display device and the dummy substrate 30. Although general polyimide has a linear expansion coefficient approximately not less than 20 ppm/° C. and not greater than 60 ppm/° C., appropriately selecting baking conditions can bring it close to 4 ppm/° C. compatible to the linear expansion coefficient of glass. For example, high temperature and/or long time baking can lower the linear expansion coefficient. Any appropriate resin film or substrate material other than the above-mentioned glass plate may be used as a device substrate. The resin material can be selected in consideration of matching with the linear expansion coefficient of the substrate material. Besides polyimide, for example, transparent polyimide, PEN, PET, COP, COC, PC and the like can be used.

Next, as understood from FIGS. 2A and 3A, as step S3 of the flowchart illustrated in FIG. 1, the manufacturing method includes baking the resin coating layer 11b to form the baked resin film 11c by increasing the temperature of the resin coating layer 11b up to the curing temperature of the resin material 11a, for example, approximately 450° C. This baking process can form the short-wavelength light absorbing layer 11d along the interface between the baked resin film 11c and the dummy substrate 30 as illustrated in FIG. 3A. The resin coating layer 11b is in contact with the dummy substrate 30 (e.g., ITO, silicon nitride layer, or the like), which is different from the resin material, at the time of baking the resin coating film 11b, therefore the short-wavelength light absorbing layer 11d is formed as a result of deterioration of the contact surface of the resin material 11a. Consequently, short-wavelength light such as ultraviolet rays can be easily absorbed than the resin material 11a. The thickness of the short-wavelength light absorbing layer 11d is approximately not less than 5 nm and not greater than 100 nm. To obtain a layer that can easily absorb the short-wavelength light, it is preferable to coat the dummy substrate 30 with an ultrathin layer of adhesion improvement surface modifier, such as silane coupling agent or the like, before baking to form the resin coating layer 11b. Through the baking, the baked resin film 11c in close contact with the dummy substrate 30 via the short-wavelength light absorbing layer 11d can be obtained. According to the present embodiment, since the resin coating layer 11b and the dummy substrate 30 are in close contact with each other, no floating occurs between the resin coating layer 11b and the dummy substrate 30. However, in the case of the presence of air bubbles, the short-wavelength light absorbing layer 11d is not formed in this floating region and a gap may be formed between the baked resin film 11c and the dummy substrate 30. Therefore, peeling will be easy.

The entire heating in an oven, for example, instead of heating the dummy substrate 30, is performed for the baking. Alternatively, it may be useful to heat the back surface of the dummy substrate 30. The temperature profile at the time of this heating is changeable according to the purpose.

More specifically, first, if air bubbles are present on the back surface of the baked resin film 11c, burr or the like is likely to be formed on the resin film 11d when the next step of forming of opening 13. Therefore, it is desired to surely prevent the entrapment of air bubbles when the resin coating layer 11b is baked. As mentioned above, since the resin material 11a is liquid when the resin coating layer 11b is formed, air bubbles are seldom entrapped. However, when the dummy substrate 30 has an uneven surface, air bubbles may be entrapped in the process of coating the liquid resin material 11a on the dummy substrate 30. Therefore, it is preferable to maintain the temperature at a level not exceeding 100° C. for the period of time not less than 10 minutes and not greater than 60 minutes in the initial state of baking. Low-temperature and/or long-time heating is preferable in that air bubbles entrapped in the resin coating layer 11b can be smoothly released from the surface of the resin coating layer 11b. When the temperature is not greater than 100° C., no curing occurs and fluidity increases and, as a result, the entrapped air bubbles expand. Therefore, air bubbles can be easily released from the surface of the resin coating layer 11b whose thickness is approximately not less than 10 μm and not greater than 20 μm. Also, in the process of increasing the temperature for the baking, the temperature does not always rise uniformly over the entire surface. From this point, securing sufficient time at the initial stage of temperature rise can bring an effect that the temperature of the resin coating layer 11b tends to become uniform.

Secondly, in the case of the resin material 11a made of polyimide, the linear expansion coefficient changes depending on baking conditions, as mentioned above. Therefore, as mentioned above, the resin film 11 can be baked under a burning condition that the linear expansion coefficient of the resin film 11 make to be close to that of the substrate for vapor deposition 20 and the dummy substrate 30. For example, although the baking of polyimide is performed at approximately 450° C., further raising the temperature up to 500° C. and leaving the baked film for the period of time approximately not less than 10 minutes and not greater than 60 minutes is effective to lower the linear expansion coefficient. Alternatively, holding the same temperature for 30 minutes or more after completing the baking at approximately 450° C. is effective to lower the linear expansion coefficient of the resin film 11. To the contrary, performing the baking with a profile including a large stepwise increase in temperature (according to which the temperature is greatly increased and then maintained for a long time) can increase the linear expansion coefficient of the resin film 11. From the above viewpoints, it is preferable to bake the resin coating layer 11b by raising the temperature stepwise at an interval not less than 10° C. and not greater than 200° C. every five to 120 minutes until the temperature reaches the baking temperature. The above-mentioned range can be further specified by the properties of the objective resin film, the resin material, and the like.

Next, as understood from FIGS. 2B and 3B, as step S4 of the flowchart illustrated in FIG. 1, the manufacturing method includes irradiating the baked resin film 11c attached to the dummy substrate 30 with the laser beam to form the resin film 11 having desired openings 13 on the baked resin film 11c.

For example, as illustrated in FIG. 7A, the laser mask 41 having a desired pattern of openings 41a and an optical lens 42 can be positioned in a predetermined relationship to irradiate the baked resin film 11c with the laser beam from the front side thereof, so that the pattern of the openings 41a reduced in size can be transferred onto the baked resin film 11c. A stepper (not illustrated) moves the laser beam irradiation device to successively form the pattern of the openings 13 on the large surface of the baked film 11c, thereby obtaining the resin film 11 (having the openings 13 formed completely). Although the optical lens 42 is not necessarily required, it is effective to increase the irradiation energy density on the surface to be processed. In this case, the optical lens 42 is disposed downstream of the laser mask 41 in the traveling orientation of the laser beam (on the side of the baked resin film 11c) and can focus the laser beam. For example, when the used optical lens 42 is a lens of 10 times, the energy density becomes 100 times. However, the transfer pattern of the laser mask 41 has a scale of 1/10. Through this laser beam irradiation, the laser beam having transmitted through the openings 41a of the laser mask 41 burns off a part of the baked resin film 11c. As a result, in accordance with the pattern of the openings 41a of the laser mask 41 irradiated with the laser beam, a fine pattern of the openings 13 identical or reduced in size can be formed on the baked resin film 11c. Thus, the resin film 11 having the fine pattern can be formed on the dummy substrate 30.

Laser beam irradiation conditions are variable depending on the material and thickness of the baked resin film 11c to be processed as well as the size and shape of the openings 13. In general, the pulse frequency of the laser beam is not less than 1 Hz and not greater than 60 Hz, and the pulse width is not less than 1 nanosecond (nsec) and not greater than 15 nanoseconds. The energy density of the laser beam on the irradiation surface per pulse is not less than 0.01 J/cm² and not greater than 1 J/cm².

To obtain the deposition mask 10 usable in vapor depositing an organic layer of an organic EL display device, for example, in the case of forming openings of 60 μm square in a matrix pattern at intervals of approximately 60 μm, a laser beam having a wavelength of 355 nm (third harmonics of the YAG laser) is used, in the above mentioned example, to irradiate the baked resin film 11c made of polyimide and 5 μm thick with the laser beam so as to satisfy the conditions that the pulse frequency is 60 Hz, the pulse width is 7 nsec, the energy density on the irradiation surface is 0.36 J/cm² per pulse, and the shot number (i.e., the number of pulses to be irradiated) is 100.

However, the laser beam to be irradiated is not limited to the YAG laser. Any other laser having a wavelength that can be absorbed by the resin material is employable. For example, the excimer laser and the He—Cd laser can emit laser beams usable. It is needless to say that the irradiation conditions will vary if a laser beam source is changed or the resin material is changed. In the above-mentioned example, the formation of the opening pattern requires laser beam irradiation of 100 shots, but a through-hole can be opened in about 50 shots when the thickness of the polyimide film is 5 μm.

Figure 5A:
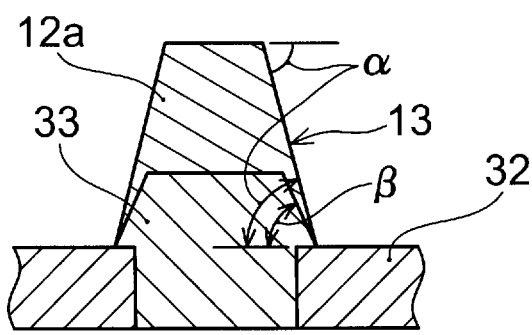
FIG. 5A illustrates a taper angle of an opening of a deposition mask according to the present disclosure.
Figure 5B:
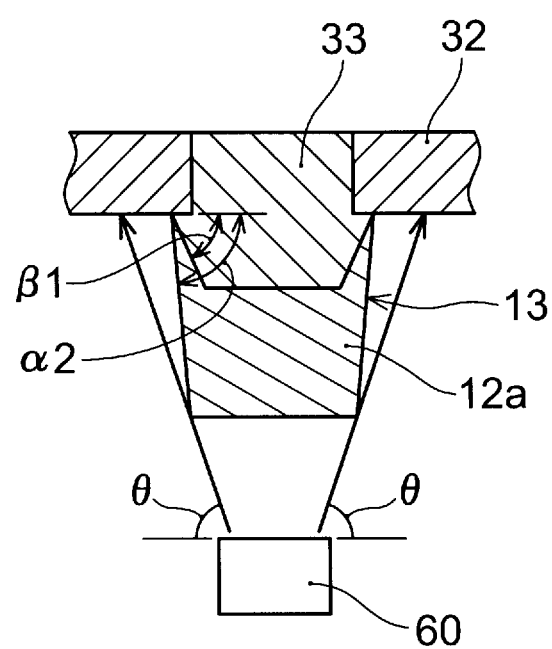
FIG. 5B illustrates vapor deposition of a deposition material using a deposition mask according to the present disclosure.
Figure 5C:
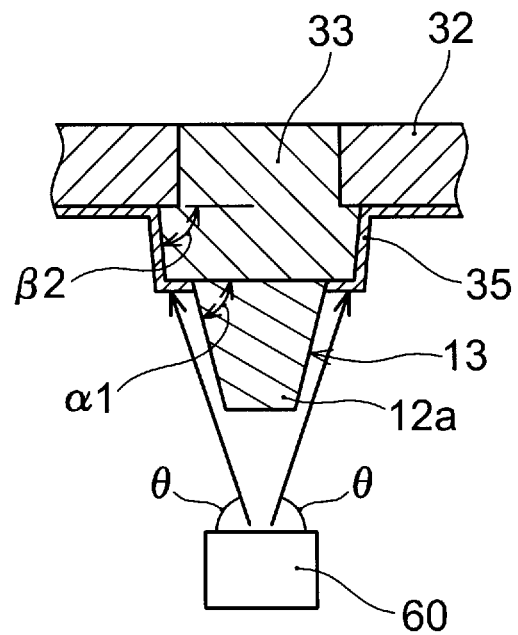
FIG. 5C illustrates a problem arising when the taper angle of the opening of the deposition mask is greater than a vapor deposition angle of a vapor deposition source.

As illustrated in FIG. 5A (although only half of the opening 13 is illustrated on both sides of the dummy bank 33 in FIG. 5A), the opening 13 has an open area decreasing from one surface 10a to the other surface 10b of the deposition mask 10 (see FIG. 3D). More specifically, it is preferable to form the opening 13 in a taper shape. That is, a taper angle α of the opening 13, more specifically, the taper angle α of the convex portion 12a remaining as a result of the formation of the opening 13 (the angle formed between the bottom surface of the taper shape and the inclined surface) is preferable identical to or smaller than a vapor deposition angle θ of a vapor deposition beam of the deposition material to be evaporated from a vapor deposition source 60 (see FIG. 5B). The vapor deposition angle θ is a complementary angle of a half of the evaporating angle of the deposition material. When the taper angle α of the opening 13 of the deposition mask 10 is equal to the vapor deposition angle θ of the vapor deposition source 60, or when the taper angle α is a smaller angle α1, even side-end vapor evaporation particles of the vapor evaporation beam evaporated from the vapor deposition source 60 can be deposited on an end portion of the first electrode 22 exposed on the bottom surface of the opening 13, without being blocked by the deposition mask 10, at the time of vapor deposition, as illustrated in FIG. 5B. On the other hand, if the taper angle α of the opening 13 is an angle α2 greater than the vapor deposition angle θ, the deposition material will not be surely deposited at an end of the bottom surface of the opening 13 because the evaporated deposition material is blocked by the convex portion 12a of the deposition mask 10, as illustrated in FIGS. 5B and 5C.

Figure 7B:
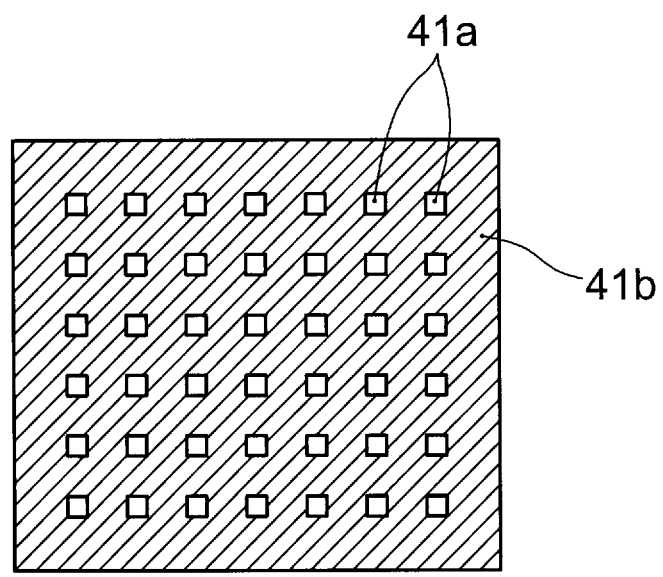
FIG. 7B illustrates the formation of openings of the deposition mask by laser beam irradiation.
Figure 7C:
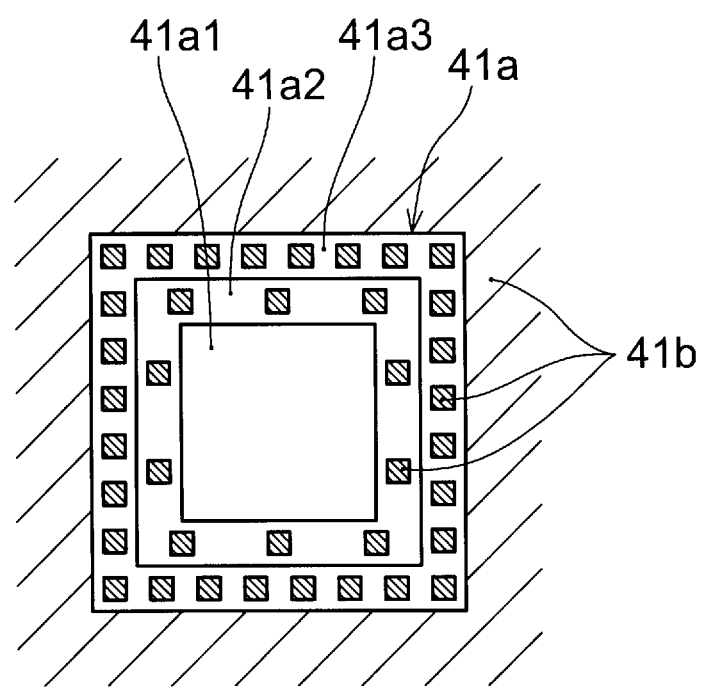
FIG. 7C illustrates the formation of openings of the deposition mask by laser beam irradiation.

The deposition mask having the taper-shaped opening 13 can be obtained by forming the peripheral portion of the openings 41a of the above-mentioned laser mask 41 (see FIG. 7A), for example, in such a manner that the transmittance of the laser beam deteriorates toward the peripheral edge. For example, the above-mentioned laser mask 41 can be formed in the following manner. More specifically, as illustrated in FIG. 7B, a light-shielding thin film 41b made of chrome or the like is formed on a transparent substrate such as a quarts glass plate, which can transmit the laser beam. Subsequently, patterning the light-shielding thin film 41b can form the openings 41a. Therefore, for example, as conceptually illustrated in FIG. 7C, a spot-like formation of the openings 41a on the light-shielding thin film 41b can be realized. According to the example illustrated in FIG. 7C, the each of openings 41a is conveniently divided into a first region 41a1, a second region 41a2, and a third region 41a3, although such a partitioning is unnecessary. In the first region 41a1, the light-shielding thin film 41b is not formed at all and therefore the transmittance is 100%. In the second region 41a2, formation of the light-shielding thin film 41b is formed sparsely and the area thereof is approximately 20%. As a result, the transmittance in the second region 41a2 is 80%. In the third region 41a3, the area occupied by the light-shielding thin film 41b is approximately 50%. As a result, the transmittance in the third region 41a3 is approximately 50%. By forming the laser mask 41 so as to steeply change the transmittance toward its peripheral edge, the opening 13 having a large taper angle α can be obtained. To the contrary, by forming the laser mask 41 so as to moderately change the transmittance toward its peripheral edge, the opening 13 having a smaller taper angle α can be obtained.

In this example, for easy understanding, the light-shielding thin film 41b is explicitly divided into the first region 41a1, the second region 41a2, and the third region 41a3 and the distribution of the light-shielding thin film 41b is dispersive. However, since the transfer resolution of the actual laser beam is 2 μm, for example, a 2 μm square can be equally divided into five sub-squares in both vertical and horizontal directions and the transmittance of the laser beam can be adjusted by forming the light-shielding thin film 41b at a part of 25 segments. Setting the transmittance continuously becoming smaller toward the periphery can form the taper-shaped opening 13.

When the transmittance of the laser beam gradually decreases in this manner, the laser beam entering the baked resin film 11c becomes weak and also the force for ablating the baked resin film 11c becomes weak. As a result, the amount removed from the surface side decreases toward the peripheral region and the opening 13 becomes a taper shape.

Next, as understood from FIGS. 2C and 3C, as step S5 of the flowchart illustrated in FIG. 1, the manufacturing method includes attaching the frame body 14 to the periphery of the baked resin film 11c where the openings 13 are formed. The attachment of the frame body 14 is for facilitating the handling of the resin film 11 without causing any damage, after acquisition of the deposition mask 10 by peeling off the baked resin film 11c from the dummy substrate 30. In attaching the frame body 14 to the periphery of the resin film 11, it is preferable to use a completely curable adhesive agent, such as epoxy resin, which does not generate unnecessary release of gas at the time of subsequent vapor deposition.

According to a conventional manufacturing method, a process of applying a tensile force to the resin film 11 in attaching it to the frame body 14 is necessary. Therefore, the frame body 14 is required to have sufficient rigidity endurable against this force. The used one was a metal plate having a thickness not less than 25 mm and not greater than 50 mm. This is called as a stretching process. However, in the embodiment of the present disclosure, the stretching process can be omitted because the frame body 14 is attached in the state where the baked resin film 11c and the dummy substrate 30 are joined together. Accordingly, the frame body 14 is not indispensable and can be omitted.

Therefore, the mechanical strength to be satisfied by the frame body 14 is relatively lower. For example, a metal plate having a thickness of approximately 1 mm to 20 mm, or a comparable plastic plate, can be used. However, in consideration of fixation during the vapor deposition, it is preferable to use a magnetic metal plate as the frame body 14 because of availability of the magnetic force for the fixation. As mentioned above, since the deposition mask 10 is preferably greater than the substrate for vapor deposition 20, if the size of the dummy substrate 30 is identical to the size of an actual substrate for vapor deposition, it is preferable that the frame body 14 is attached to the outer periphery thereof.

Subsequently, as understood from FIGS. 2D and 3D, as step S6 of the flowchart illustrated in FIG. 1, the manufacturing method includes peeling off the resin film 11 from the dummy substrate 30 to obtain the deposition mask 10. Peeling off the resin film 11 from the dummy substrate 30 can leave recessed portions 12b on the other surface (back surface) 10b side of the resin film 11. To peel off the resin film 11 from the dummy substrate 30, the laser beam irradiation is performed so as to further deteriorate the short-wavelength light absorbing layer 11d. More specifically, the laser beam irradiation in the above-mentioned formation of the openings 13 is performed in such a way as to irradiate only the portion where the openings 13 are to be formed with the laser beam that can be easily absorbed by the resin film 11. And the short-wavelength light absorbing layer 11d under the openings 13 disappears correspondingly. In this process, the entire surface is irradiated with the laser beam that is hardly absorbed by the resin film 11. Therefore, the laser beam irradiation is so weak that the baked resin film 11c itself does not deteriorate. From that viewpoint, the laser beam may be replaced by short-wavelength light that can be radiated from a xenon lamp, a high-pressure mercury lamp, an ultra violet LED, or the like.

Irradiating the entire surface with this kind of short-wavelength light can further deteriorate the short-wavelength light absorbing layer 11d, without causing any change in the resin film 11. As a result, the bonding power between the dummy substrate 30 and the resin film 11 having uneven surfaces is lost and the resin film 11 can be easily separated from the dummy substrate 30. Therefore, though even in the case of using a conventional planar film, it was necessary to employ a troublesome method including immersion in oil for separation, in this embodiment it is unnecessary. In addition, there is no chance that the moisture adheres, which is undesirable to an organic layer. Further, the resin film 11 can be easily separated from the dummy substrate 30 without damaging the pattern of the openings 13. As a result, the deposition mask 10 can be obtained. If necessary, coating a parting agent may be provided on the surface of the dummy substrate 30 before forming the resin coating layer 11b may be useful to facilitate the peeling.

Next, an exemplary method for manufacturing an organic EL display device with the use of the deposition mask 10 made of the resin film manufactured as mentioned above will be described in detail below. Since a conventionally known method is employable to manufacture the members other than the deposition mask 10, only an organic layer deposition method using the deposition mask 10 will be described.

The organic EL display device manufacturing method according to the present embodiment includes forming the deposition mask 10 by using the above-mentioned method, as a step to be performed first. More specifically, the manufacturing method includes preparing the dummy substrate 30 having irregularity corresponding to the uneven surface of the substrate for vapor deposition 20 (see FIG. 4A) on which an organic layer is to be deposited. The manufacturing method further includes coating the liquid resin 11a on the uneven surface of the dummy substrate 30 until a surface becomes substantially flat and then baking it to obtain the baked resin film 11c, and further includes irradiating the baked resin film 11c with the laser beam to form the pattern of the openings 13, thereby obtaining the resin film 11. The manufacturing method further includes peeling off the resin film 11 from the dummy substrate 30 to obtain the deposition mask 10. In the case of forming a deposition mask to be used in vapor depositing the same organic material on each of RGB sub pixels, the deposition mask 10 can be formed into the shape illustrated in FIG. 3D in which openings are formed so as to correspond to all of the sub pixels. In the case where the different organic materials to be deposited on respective RGB sub pixels, a deposition mask 10R having openings dedicated to only the sub pixels R, a deposition mask 10G having openings dedicated to only the sub pixels G, and a deposition mask 10B having openings dedicated to only the sub pixels B are prepared beforehand. In the case of vapor depositing the same organic material on the R and G sub pixels and vapor depositing the different organic material on only the B sub pixels, a deposition mask 10RG (not illustrated) having openings dedicated to the R and G sub pixels and having no opening dedicated to the B sub pixels is prepared beforehand. There may be various combinations in forming the deposition mask 10 beforehand.

Figure 4B:
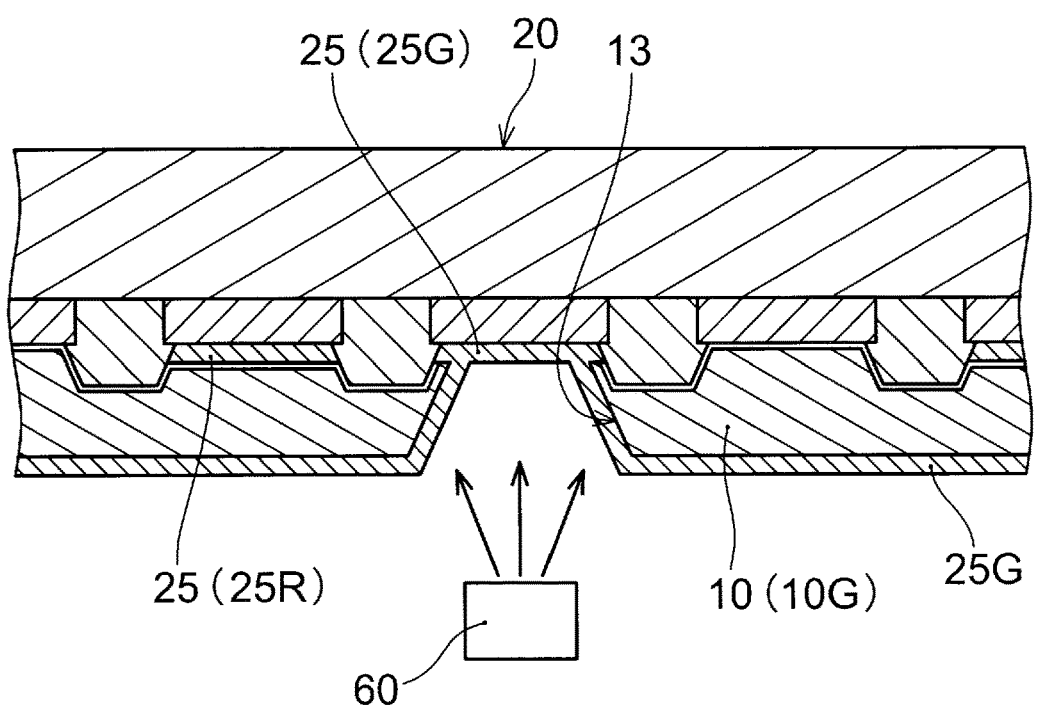
FIG. 4B is a cross-sectional view illustrating a manufacturing process of the organic EL display device manufacturing method according to the present disclosure.
Figure 4C:
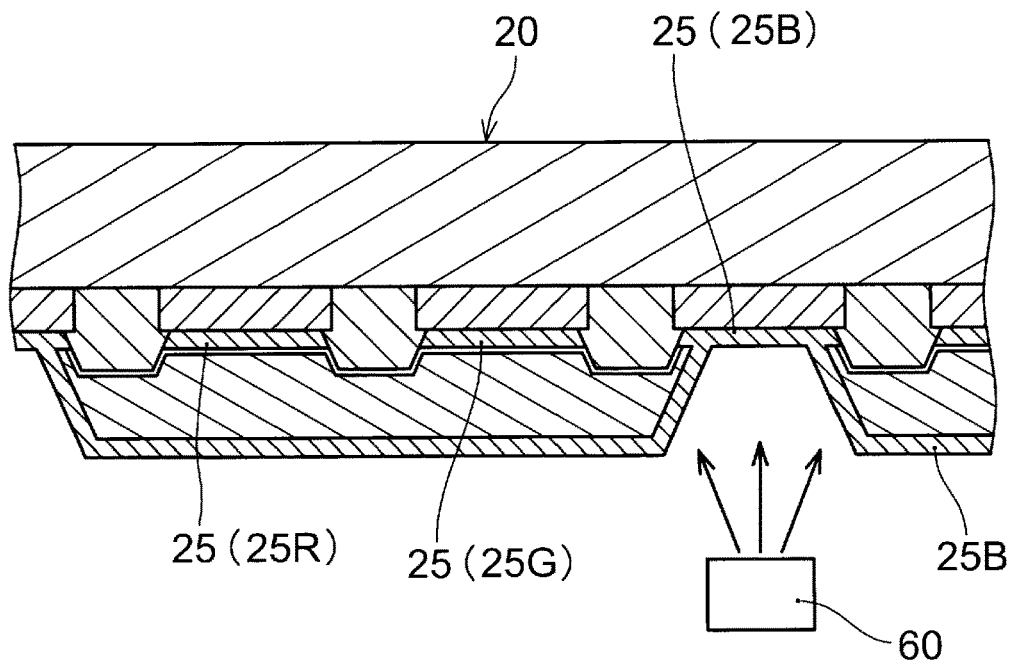
FIG. 4C is a cross-sectional view illustrating a manufacturing process of the organic EL display device manufacturing method according to the present disclosure.

As illustrated in FIG. 4A, the manufacturing method further includes positioning and overlapping the above-mentioned deposition mask 10 (10R or the like) on the substrate for vapor deposition 20, which includes the TFT substrate 21 mounting TFTs, the flattening layer, and the like, the first electrodes 22, and the banks 23 partitioning respective sub-pixels. The manufacturing method further includes vapor depositing the organic material to form an organic layer 25 (25R or the like) deposited on the substrate for vapor deposition 20. Since the uneven surface shape of the dummy substrate 30 is substantially the same as the surface shape of the substrate for vapor deposition 20, the deposition mask 10R can completely to and cover the sidewall of the bank 23. In the illustration of FIGS. 4A to 4C, to clarify the boundary between the deposition mask 10 and the substrate for vapor deposition 20, the boundary portion is drawn as a gap and therefore the deposition mask 10 protrudes unnaturally at the sidewall portion. However, no actual gap is present. Only the deposition mask 10 thinly covering the sidewall is present, and the formation of the organic layer 25 extends to the base of the sidewall of the bank 23.

Although not illustrated in the drawing, for example, the TFT substrate 21 includes switching elements, such as TFTs, formed on a glass plate for respective RGB sub pixels of each pixel. The first electrodes (e.g., anodes) 22 and wiring connected to the switching elements are formed as a combination film of a metal film (Ag or APC) and an ITO film on the flattening layer. As illustrated in FIG. 4A, the insulating bank 23 made of $SiO_2$ or the like for separating between the adjacent sub pixels is formed. The above-mentioned deposition mask 10 is positioned and fixed on the bank 23 of the TFT substrate 21. The opening 13 of the deposition mask 10 is formed in a tapered shape as mentioned above.

In this state, an organic material 24 is vapor-deposited in a vapor deposition apparatus. The organic material 24 is vapor-deposited only in the opening 13 of the deposition mask 10. And, the organic layer 25 (25R) is formed on the first electrode 22 of the desired sub pixel. The vapor deposition in this case includes scanning the vapor deposition source 60, which is constituted by a linear source arranged with crucible or the like (extending in the back and forth (vertical) direction in the drawing), in the right and left direction for performing vapor deposition over the large-sized surface on which a plurality of substrates for vapor deposition 20 is formed. As mentioned above, the vapor deposition source 60 evaporates the deposition material within a centrally directed range defined by the vapor deposition angle θ, which is dependent on the shape of its evaporation port. Therefore, for example, if the each opening 13 of the deposition mask 10 is close to a right angle, the deposition material hardly reaches the periphery of the bottom surface (the exposed surface of the first electrode 22) of the opening 13 of the deposition mask 10. Accordingly, the obtainable deposition layer is not uniform. However, when the taper angle α of the opening 13 of the deposition mask 10 (see FIG. 5A) is not greater than the vapor deposition angle θ, as illustrated in FIG. 5B, the film thickness of the deposited organic layer 25 is uniform even at the periphery of the bottom surface.

In the organic layer 25 deposited with some different material, an organic layer of the material corresponding to each of RGB colors is deposited to constitute a light-emitting layer. When emphasis is placed on light-emitting performance, it is preferable to separately deposit a material suitable for the light-emitting layer to constitute a hole transport layer and an electron transport layer. However, in consideration of material costs, the same material may be deposited commonly for two or three of RGB colors in some cases. In the case of depositing the common material for sub pixels of two colors or more, a deposition mask having the openings 13 corresponding to the common sub pixels is used. In the case where vapor deposition layers of respective sub pixels are different from each other, for example, it is feasible to use one deposition mask 10R for the R sub pixel and continuously deposit respective organic layers. In the case of depositing the organic layer common to RGB, it is feasible to deposit the organic layer of each sub pixel beneath the common layer and then deposit the organic layer common to all pixels at a time by using the deposition mask 10 having openings common to RGB.

Although FIG. 4A illustrates an exemplary deposition of the organic layer deposited only on the R sub pixel, when the organic layer is deposited only on the G sub pixel, as illustrated in FIG. 4B, the deposition mask 10G having the opening 13 dedicated to only the G sub pixel and covering other R and B sub pixels is used. In this case, since the organic layer 25R is already formed on the R sub pixel, the deposition mask 10G is preferable a mask avoiding this portion. However, even in the case of vapor depositing all the organic layers of the organic layer 25, its thickness is negligible (approximately 500 nm) and no problem will arise.

Subsequently, as illustrated in FIG. 4C, the deposition mask 10 is replaced by the deposition mask 10B dedicated to B color, and the deposition material is deposited only on the B sub pixel similar to the above-mentioned example. Although this example describes vapor depositing the organic layer separately for each of RGB sub pixels, when the organic material is common to RGB colors, the same material is deposited on two or more pixels collectively.

Although the organic layer 25 is simply illustrated as a single layer in FIGS. 4A to 4C, the organic layer 25 actually formed has a multi-layered structure constituted by a plurality of layers made of different materials, as mentioned above. For example, as a layer in contact with the anode (first electrode) 22, a hole injection layer made of a material excellent in consistency of ionization energy for improving hole injection property may be provided. A hole transport layer, which is made of, for example, amine-based material and capable of improving the stability in transporting holes and serving as an energy barrier confining electrons in the light-emitting layer, is formed on the hole injection layer. In addition, a light-emitting layer to be selected according to the light-emission wavelength is formed on this layer, for example, by doping red or green organic phosphor material into $Alq_3$, for the red or green wavelength. As a material for blue color, a DSA-based organic material is usable. In addition, an electron transport layer made of $Alq_3$ or the like, which is capable of improving electron injection property and stably transporting electrons, is formed on the light-emitting layer. Successively depositing these layers each having a thickness of approximately several tens nm can form the organic layer 25. Optionally, an electron injection layer made of LiF, Liq, or the like, which is capable of improving electron injection property, may be provided between the organic layer 25 and the metal electrode.

Figure 4D:
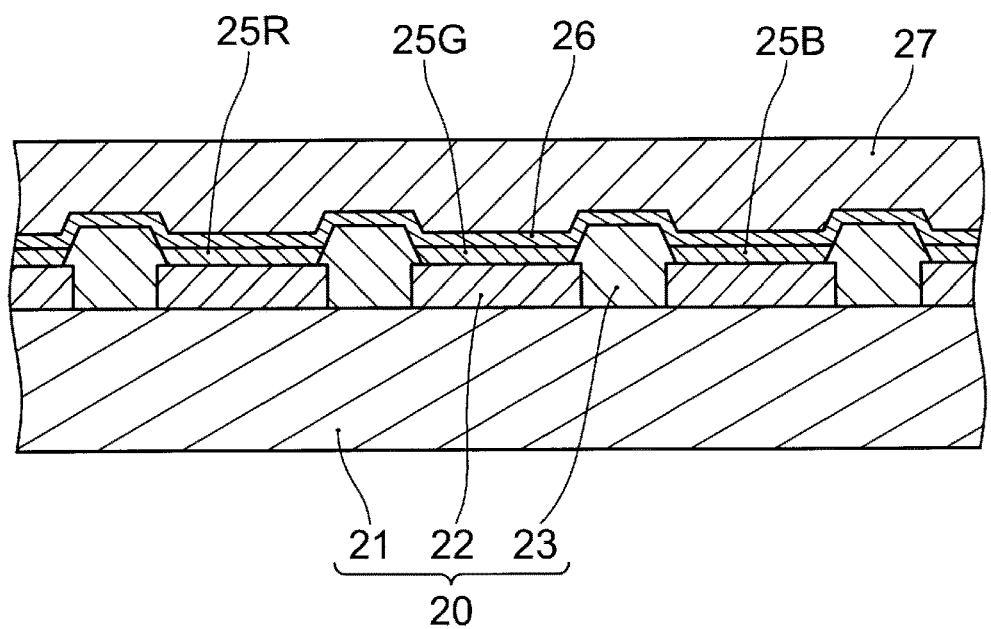
FIG. 4D is a cross-sectional view illustrating a manufacturing process of the organic EL display device manufacturing method according to the present disclosure.

Upon completing the formation of all of the organic layer 25 and the electron injection layer, such as LiF layer, the deposition mask 10 is removed and a second electrode (e.g., cathode) 26 is formed on the entire surface. The example illustrated in FIG. 4D is a top emission type configured to emit light from the upper side. Therefore, the second electrode 26 is formed of a translucent material, for example, a thin Mg—Ag eutectic layer. In addition, Al or the like can be used. In the case of a bottom emission type configured to emit light from the TFT substrate 21 side, the first electrode 22 can be made of ITO, $In_3O_4$, or the like and the second electrode 26 can be made of a metal whose work function is small, such as Mg, K, Li, Al, or the like. A protection film 27 made of, for example, $Si_3N_4$ or the like is formed on the surface of the second electrode 26. Although not illustrated, a sealing layer made of glass or a resin film is provided to seal the whole so as to prevent the organic layer 25 and the second electrode 26 from absorbing moisture, oxygen, and the like. Further, another employable structure includes the organic layer 25 as common as possible and color filters provided on its surface.

Figure 5D:
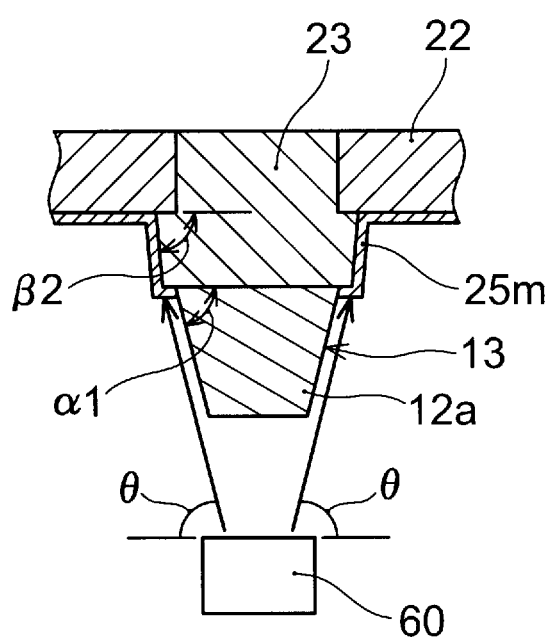
FIG. 5D illustrates a problem arising when the taper angle of a bank of a TFT substrate is greater than the taper angle of the opening of the deposition mask.

The above-mentioned bank 23 is formed to have a taper shape in cross section. The taper angle β (see FIG. 5A) is preferably equal to the vapor deposition angle θ of the deposition material evaporated from the vapor deposition source 60 of the above-mentioned organic material or is preferably an angle β1 (see FIG. 5B) smaller than the vapor deposition angle θ. If the taper angle β of the bank 23 is greater than the vapor deposition angle θ, similar to the taper shape of the opening 13 of the deposition mask 10 described above, vapor deposition particles evaporated from the side-end of the vapor deposition beam evaporated from the vapor deposition source 60 are blocked by the bank 23 and a sufficient amount of deposition material cannot be deposited on the end portion of the bank 23 side of the first electrode 22. The taper angle β of the bank 23 is preferably smaller than the taper angle α of the opening 13 of the deposition mask 10. If the taper angle β of the bank 23 is an angle β2 greater than the taper angle α of the opening 13 of the deposition mask 10, the bank 23 cannot be covered by the convex portion 12a of the deposition mask 10. As a result, as illustrated in FIG. 5D, since the deposition mask 10 is formed in such a manner that the taper angle α1 of the opening 13 of the deposition mask 10 is not greater than the vapor deposition angle θ of the vapor deposition source 60, the bank 23 is exposed from the deposition mask 10 and a deposition material 25*m* is undesirably deposited on a shoulder portion and the sidewall of the bank 23. As a result, in the case of vapor depositing the organic material, the light is emitted in an oblique direction from the sidewall of the bank 23 and crosstalk occurs between neighboring pixels, resulting in deterioration in display quality. Accordingly, to obtain the organic EL display device including the uniformly deposited organic layer 25, the shape of the bank 23 on the substrate for vapor deposition 20 side is necessary to be a shape having a taper angle not greater than the vapor deposition angle θ, more preferably, a shape having a taper angle not greater than the taper angle α of the opening 13 of the deposition mask 10. The following method will be employable to form the bank 23 having the above-mentioned taper angle.

More specifically, for example, in the case where the bank 23 is formed of an inorganic substance, such as $SiO_2$, $Si_3N_4$, or the like, when performing dry etching or wet etching to form the bank 23, optimizing resist film forming conditions, such as adjustment of the adhesion force with the material of the resist film and adjustment of the film thickness as well as selection of etchant, can adjust the taper angle.

Further, in the case where the bank 23 is formed of an organic substance, if the organic substance is a photosensitive resin, adjusting exposure conditions such as defocusing, developing conditions such as developer and temperature, and baking temperature conditions such as pre-baking temperature and curing temperature can obtain a desired taper angle. If the bank 23 is a non-photosensitive resin, performing the same procedure as in the case of the above-mentioned inorganic substance can obtain a desired taper angle.

The taper angle β of the bank 23 is preferably the same or smaller than the taper angle α of the opening 13 of the deposition mask 10, as apparent from FIG. 5A. This is because, even when the taper angle α of the opening 13 of the deposition mask 10 is reduced with the intent to prevent the deposition material from being blocked, the blocking of the deposition material will occur against the intention if the taper angle β of the bank 23 is larger than the taper angle α of the opening 13. As a result, as illustrated in FIG. 5D, the deposition material 25*m* is deposited on the shoulder portion and the sidewall of the bank 23. More specifically, a relationship α≥β preferably holds. On the other hand, as mentioned above, the taper angle α of the opening 13 of the deposition mask 10 is preferably not greater than the vapor deposition angle θ of the vapor deposition source 60. As a result, a relationship θ≥α≥β preferably holds between the vapor deposition angle θ, the taper angle α of the opening 13 of the deposition mask 10, and the taper angle β of the bank 23 (the dummy bank 33).

REFERENCE SIGNS LIST

10 deposition mask
10*a* one surface
10*b* other surface
11 resin film
11*a* resin material
11*b* resin coating layer
11*c* baked resin film
11*d* short-wavelength light absorbing layer
12 uneven shape part
12*a* convex portion
12*b* concavity
13 opening
14 frame body
20 substrate for vapor deposition
21 TFT substrate
22 first electrode
23 bank
24 organic material
25 organic layer
26 second electrode
37 protection film
30 dummy substrate
41 laser mask
41*a* opening
41*b* light-shielding thin film
42 optical lens

The invention claimed is:

1. A deposition mask for forming a deposition layer by vapor deposition at a predetermined place on a surface of a substrate for vapor deposition having a surface of irregularity,
   wherein the deposition mask is formed of a resin film so as to have one surface having a flat surface and the other surface having an uneven surface corresponding to an inversed shape of the surface of irregularity of the substrate for vapor deposition, and
   wherein the deposition mask has an opening formed at a portion corresponding to the predetermined place; wherein the opening is formed in a taper shape in such a manner that an open area decreases in a direction from the one surface to the other surface, and a taper angle of the taper shape is equal to or less than a vapor deposition angle of a deposition material evaporating from a deposition material source.

2. The deposition mask according to claim 1, wherein the resin film is made of a polyimide so that a difference between a linear expansion coefficient of the resin film and a linear expansion coefficient of the substrate for vapor deposition becomes equal to or less than 3 ppm/° C.

3. A method for manufacturing a deposition mask for forming a deposition layer at a predetermined place on a surface of a substrate for vapor deposition having an irregularity on the surface, by depositing a deposition material at the predetermined place, the manufacturing method comprising:
   preparing a dummy substrate having an irregularity on a surface thereof corresponding to the irregularity of the surface of the substrate for vapor deposition;
   forming a resin coating layer by coating the irregularity of the surface of the dummy substrate with a liquid resin material, the liquid resin material being applied until a surface thereof becoming substantially flat;
   forming a baked resin film by raising the temperature of the resin coating layer up to a hardening temperature of the resin material to bake the resin coating layer;
   forming a resin film having a desired opening pattern by irradiating the baked resin film attached to the dummy substrate with a laser beam to form the desired opening pattern on the baked resin film; and
   peeling off the resin film from the dummy substrate to obtain a deposition mask.

4. The method for manufacturing the deposition mask according to claim 3, wherein when forming the opening pattern with irradiation of the laser beam, the laser beam is irradiated such that a periphery of each opening of the opening pattern is formed into a taper shape in the thickness direction on the resin film, by forming a laser mask such that the transmittance of the laser beam deteriorates toward a peripheral edge of an opening at the periphery of the opening of the laser mask.

5. The method for manufacturing the deposition mask according to claim 3, wherein the baking of the resin coating layer is performed while adjusting at least one of coating thickness of the resin material, baking temperature at the time of baking, baking time, and a profile of the baking temperature and the baking time, so that a difference between a linear expansion coefficient of the baked resin film formed by baking and a linear expansion coefficient of the substrate for vapor deposition becomes equal to or less than 3 ppm/° C.

6. The method for manufacturing the deposition mask according to claim 3, further comprising selecting a material of the dummy substrate so that a difference between a linear expansion coefficient of the baked resin film formed by baking and a linear expansion coefficient of the dummy substrate becomes equal to or less than 3 ppm/° C. by performing the baking of the resin coating layer while adjusting at least one of coating thickness of the resin material, baking temperature at the time of baking, baking time, and a profile of the baking temperature and the baking time.

7. The method for manufacturing the deposition mask according to claim 3, wherein the baking of the resin material is performed by raising the temperature stepwise at an interval not less than 10° C. and not greater than 200° C. every five to 120 minutes until the temperature reaches the baking temperature.

8. The method for manufacturing the deposition mask according to claim 3, wherein a work by the laser beam irradiation is for forming a deposition mask to be used for vapor depositing an organic material for each pixel on the substrate for vapor deposition.

9. The method for manufacturing the deposition mask according to claim 3, wherein the laser beam is formed in a form of a pulsed laser.

10. The method for manufacturing the deposition mask according to claim 3, further comprising forming a frame body along the periphery of the resin film before peeling off the resin film from the dummy substrate.

11. The method for manufacturing the deposition mask according to claim 3, further comprising irradiating to an interface between the resin film and the dummy substrate with short-wavelength light focused on the interface, when peeling off the resin film from the dummy substrate, thereby reducing an adhesion force acting between the resin film and the dummy substrate.

12. A method for manufacturing an organic EL display device including a deposition of an organic material on a substrate for vapor deposition, the method comprising:
preparing a dummy substrate having an irregularity corresponding to a surface of the substrate for vapor deposition, the substrate for vapor deposition being to be deposited with the organic material;
coating a liquid resin on a surface having the irregularity of the dummy substrate until a surface thereof becoming substantially flat and baking the liquid resin to obtain a baked resin film, and irradiating the baked resin film with a laser beam to obtain a resin film having an opening pattern formed thereon;
forming a deposition mask by peeling off the resin film from the dummy substrate;
positioning and overlapping the deposition mask with the substrate for vapor deposition, the substrate for vapor deposition being formed with a TFT, a first electrode, and a bank for partitioning each pixel on a device substrate, and vapor depositing an organic material to form an organic layer on the substrate for vapor deposition; and
removing the deposition mask, and forming a second electrode.

13. The method for manufacturing the organic EL display device according to claim 12, further comprising forming the bank so as to have a taper shape in cross section so that a taper angle of the bank becomes equal to or less than a vapor deposition angle of a deposition material evaporating from a vapor deposition source of the organic material.

* * * * *